(12) United States Patent
Hytha et al.

(10) Patent No.: US 7,153,763 B2
(45) Date of Patent: Dec. 26, 2006

(54) METHOD FOR MAKING A SEMICONDUCTOR DEVICE INCLUDING BAND-ENGINEERED SUPERLATTICE USING INTERMEDIATE ANNEALING

(75) Inventors: Marek Hytha, Brookline, MA (US); Robert John Stephenson, Newton Upper Falls, MA (US); Scott A. Kreps, Southborough, MA (US)

(73) Assignee: RJ Mears, LLC, Waltham, MA (US)

( * ) Notice: Subject to any disclaimer, the term of this patent is extended or adjusted under 35 U.S.C. 154(b) by 0 days.

(21) Appl. No.: 11/136,834

(22) Filed: May 25, 2005

(65) Prior Publication Data

US 2005/0272239 A1 Dec. 8, 2005

Related U.S. Application Data

(63) Continuation-in-part of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003.

(51) Int. Cl.
   *H01L 21/3205* (2006.01)
(52) U.S. Cl. .................... 438/604; 438/3; 438/240; 438/938; 438/110; 257/9; 257/E29.298
(58) Field of Classification Search ............. 438/400, 438/3, 110, 240, 938, FOR. 270; 257/9, 257/E29.298
See application file for complete search history.

(56) References Cited

U.S. PATENT DOCUMENTS 4,485,128 A    11/1984   Dalal et al. ................. 427/85
4,594,603 A    6/1986    Holonyak, Jr. ............... 357/16
4,882,609 A    11/1989   Schubert et al. ............. 357/22
4,908,678 A    3/1990    Yamazaki ..................... 357/4
4,937,204 A    6/1990    Ishibashi et al. ............ 437/110
4,969,031 A    11/1990   Kobayashi et al. ........... 357/63
5,055,887 A    10/1991   Yamazaki ..................... 357/4
5,081,513 A    1/1992    Jackson et al. ............ 357/23.7
5,216,262 A    6/1993    Tsu ........................... 257/17
5,357,119 A    10/1994   Wang et al. .................. 257/18
5,577,061 A    11/1996   Hasenberg et al. ........... 372/45
5,594,567 A    1/1997    Akiyama et al. ............. 349/28
5,606,177 A    2/1997    Wallace et al. ............... 257/25
5,616,515 A    4/1997    Okuno ....................... 438/478
5,627,386 A    5/1997    Harvey et al. ................ 257/79
5,683,934 A    11/1997   Candelaria ................. 437/134

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Michelle Estrada
*Assistant Examiner*—Jarrett Stark
(74) *Attorney, Agent, or Firm*—Allen, Dyer, Doppelt, Milbrath & Gilchrist, P.A.

(57) ABSTRACT

A method for making a semiconductor device may include forming a superlattice including a plurality of stacked groups of layers, with each group of layers comprising a plurality of stacked base semiconductor monolayers defining a base semiconductor portion and at least one non-semiconductor monolayer constrained within a crystal lattice of adjacent base semiconductor portions. The method may also include performing at least one anneal prior to completing forming of the superlattice.

31 Claims, 10 Drawing Sheets

U.S. PATENT DOCUMENTS

| | | | |
|---|---|---|---|
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B1 | 10/2002 | Takagi | 257/77 |
| 6,498,359 B1 | 12/2002 | Schmidt et al. | 257/190 |
| 6,501,092 B1 | 12/2002 | Nikonov et al. | 257/29 |
| 6,521,549 B1 | 2/2003 | Kamath et al. | 438/786 |
| 6,566,679 B1 | 5/2003 | Nikonov et al. | 257/29 |
| 6,608,327 B1 | 8/2003 | Davis et al. | 257/76 |
| 6,621,097 B1 | 9/2003 | Nikonov et al. | 257/17 |
| 6,638,838 B1 | 10/2003 | Eisenbeiser et al. | 438/481 |
| 6,646,293 B1 | 11/2003 | Emrick et al. | 257/194 |
| 6,673,646 B1 | 1/2004 | Droopad | 438/85 |
| 6,711,191 B1 | 3/2004 | Kozaki et al. | 372/43 |
| 6,748,002 B1 | 6/2004 | Shveykin | 372/45 |
| 2002/0094003 A1 | 7/2002 | Bour et al. | 372/46 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N-and P-Type SiGe/Si Superlattice Coolers*, the Seventeenth Intersociety Conference on Thermomechanical Phenomena in Electronic Systems (ITherm 2000), vol. 1. pp. 304-307, Las Vegas, NV, May 2000.

Shah et al., *Experimental Analysis and Theoretical Model for Anomalously High Ideality Factors ($n>2.0$) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, 2004 Nanosys, Inc.

METHOD FOR MAKING A SEMICONDUCTOR DEVICE INCLUDING BAND-ENGINEERED SUPERLATTICE USING INTERMEDIATE ANNEALING

RELATED APPLICATIONS

This application is a continuation-in-part of U.S. patent application Ser. No. 10/647,060 filed Aug. 22, 2003, now U.S. Pat. No. 6,958,486 which in turn is a continuation-in-part of U.S. patent application Ser. No. 10/603,696 now abandoned and Ser. No. 10/603,621, both filed on Jun. 26, 2003, the entire disclosures of which are hereby incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2/Si$ with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 39–402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller device features.

SUMMARY OF THE INVENTION

In view of the foregoing background, it is therefore an object of the present invention to provide a method for making a semiconductor device having a higher charge carrier mobility, for example.

This and other objects, features and advantages in accordance with the invention are provided by a method for making a semiconductor device comprising forming a superlattice including a plurality of stacked groups of layers, with each group of layers comprising a plurality of stacked base semiconductor monolayers defining a base semiconductor portion and at least one non-semiconductor monolayer constrained within a crystal lattice of adjacent base semiconductor portions. More particularly, the method may also include performing at least one anneal prior to completing forming of the superlattice.

Forming the superlattice may comprise forming each group by successive deposition of the plurality of base semiconductor monolayers. In addition, performing the at least one anneal may comprise performing the at least one anneal prior to completing the deposition of all of the plurality of base semiconductor monolayers in at least one group of layers. Performing the at least one anneal may include performing the at least one anneal after completing the deposition of at least one of the plurality of base semiconductor monolayers in at least one group of layers. For example, the performing the at least one anneal may comprise performing the at least one anneal after completing the deposition of no more than eight base semiconductor monolayers, and, more preferably after no more than four base semiconductor monolayers.

Performing the at least one anneal may comprise performing the at least one anneal at a temperature in a range of about 550 to 750° C., and more preferably at a temperature in a range of about 625 to 675° C. The at least one anneal may be performed for a time period in a range of about one to thirty minutes, and more preferably in a range of about five to fifteen minutes.

Each base semiconductor portion may comprise silicon, and each at least one non-semiconductor monolayer may comprise oxygen in some embodiments. Each non-semiconductor monolayer may be a single monolayer thick, for example. In addition, each base semiconductor portion may be less than eight monolayers thick.

The superlattice may further comprise a base semiconductor cap layer on an uppermost group of layers. In some embodiments, all of the base semiconductor portions may be a same number of monolayers thick. In other embodiments, some of the base semiconductor portions may be a different number of monolayers thick.

Each base semiconductor portion may include a base semiconductor selected from the group consisting of Group IV semiconductors, Group III–V semiconductors, and Group II–VI semiconductors. Additionally, each non-semiconductor monolayer may comprise a non-semiconductor selected from the group consisting of oxygen, nitrogen, fluorine, and carbon-oxygen.

Forming the superlattice may comprise forming the superlattice on a substrate. The method may further comprise doping the superlattice with at least one type of conductivity dopant.

In some advantageous embodiments, the superlattice may define a channel for the semiconductor device. Accordingly, the method may further include forming source and drain regions laterally adjacent the superlattice channel, and forming a gate overlying the superlattice channel.

DETAILED DESCRIPTION OF THE PREFERRED EMBODIMENTS

Figure 1:
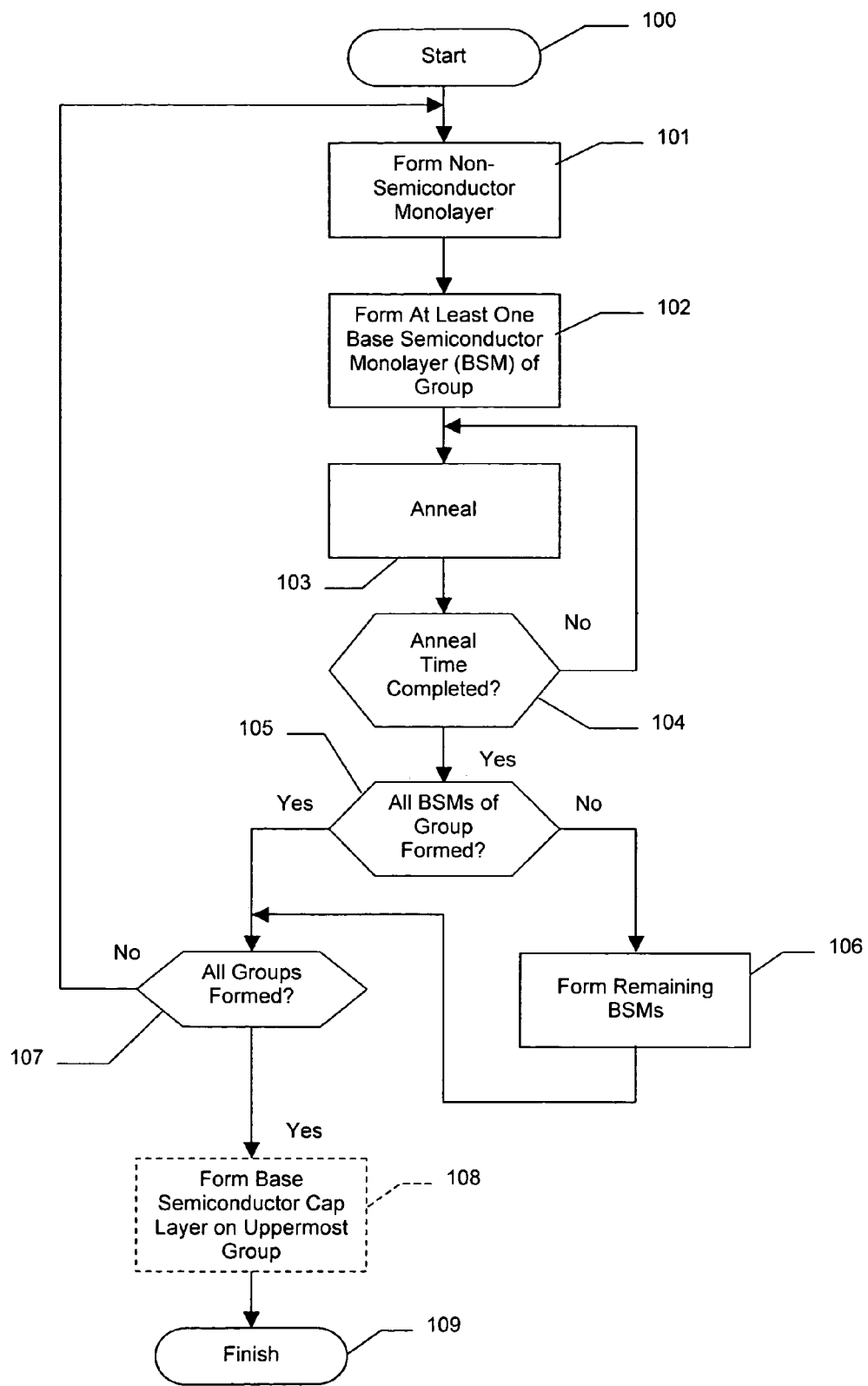
FIG. 1 is a flow diagram illustrating a method for making a semiconductor device comprising a superlattice in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, EF is the Fermi energy, T is the temperature, E(k, n) is the energy of an electron in the state corresponding to wave vector k and the nth energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

The higher charge carrier mobility may result from a lower conductivity effective mass for the charge carriers in the parallel direction than would otherwise be present. The conductivity effective mass may be less than two-thirds the conductivity effective mass that would otherwise occur. Of course, the superlattice may further comprise at least one type of conductivity dopant therein.

Using the above-described measures, one can select materials having improved band structures for specific purposes. One such example would be a superlattice 25 material for a channel region in a semiconductor device. A planar MOSFET 20 including the superlattice 25 in accordance with the invention is now first described with reference to FIG. 2. One skilled in the art, however, will appreciate that the materials identified herein could be used in many different types of semiconductor devices, such as discrete devices and/or integrated circuits.

The illustrated MOSFET 20 includes a substrate 21, lightly doped source/drain extension regions 22, 23, more heavily doped source/drain regions 26, 27, and a channel region therebetween provided by the superlattice 25. Source/drain silicide layers 30, 31 and source/drain contacts 32, 33 overlie the source/drain regions, as will be appreciated by those skilled in the art. A gate 35 illustratively includes a gate insulating layer 36 adjacent the channel provided by the superlattice 25, and a gate electrode layer 38 on the gate insulating layer. Sidewall spacers 40, 41 are also provided in the illustrated MOSFET 20, as well as a silicide layer 34 on the gate electrode layer 38. For clarity of illustration, the gate insulating layer 36 is shown with stippling in FIG. 2, and the regions of the superlattice 25 which have been implanted with dopant from the implantation of the lightly doped source/drain extension regions 22, 23 shown with dashed lines.

Applicants have identified improved materials or structures and methods for making the channel region of the MOSFET 20. More specifically, the Applicants have identified materials or structures having energy band structures for which the appropriate conductivity effective masses for electrons and/or holes are substantially less than the corresponding values for silicon.

Figure 2:
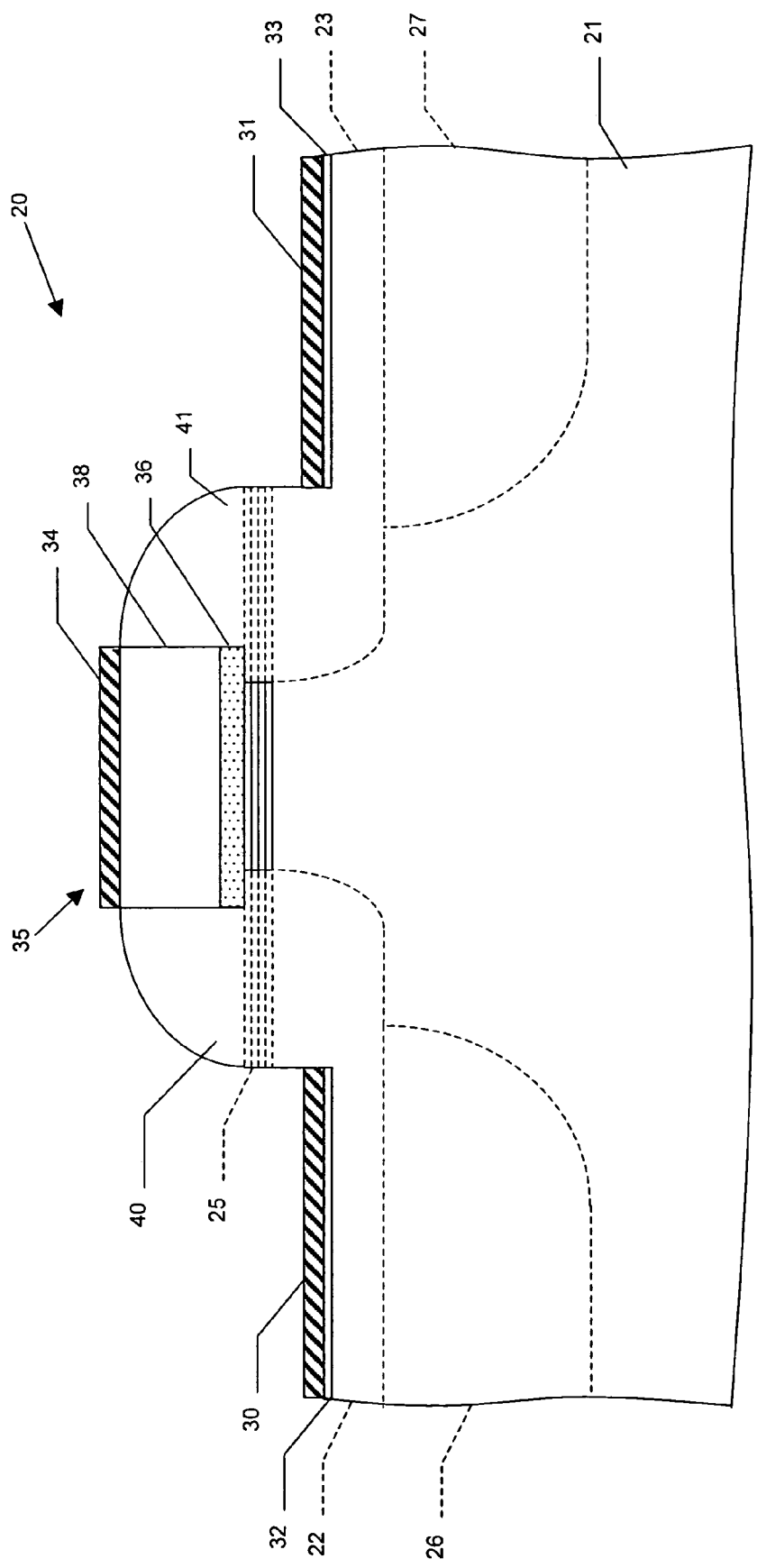
FIG. 2 is a schematic cross-sectional view of a semiconductor device formed in accordance with the present invention including a superlattice.
Figure 3:
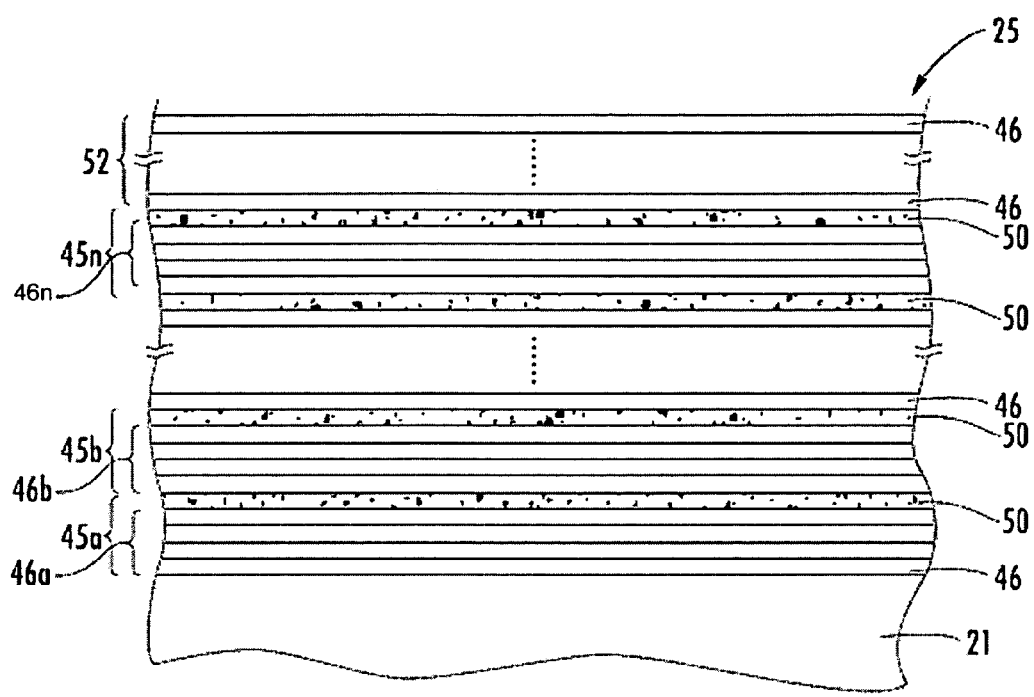
FIG. 3 is a greatly enlarged schematic cross-sectional view of the superlattice as shown in FIG. 2.

Referring now additionally to FIGS. 2 and 3, the materials or structures are in the form of a superlattice 25 whose structure is controlled at the atomic or molecular level and may be formed using known techniques of atomic or molecular layer deposition. The superlattice 25 includes a plurality of layer groups 45a–45n arranged in stacked relation, as perhaps best understood with specific reference to the schematic cross-sectional view of FIG. 3.

Each group of layers 45a–45n of the superlattice 25 illustratively includes a plurality of stacked base semiconductor monolayers 46 defining a respective base semiconductor portion 46a–46n and an energy band-modifying layer 50 thereon. The energy band-modifying layers 50 are indicated by stippling in FIG. 3 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a–45n are chemically bound together. For example, in the case of silicon monolayers 46, some of the silicon atoms in the upper or top monolayer of the group 45a will be covalently bonded with silicon atoms in the lower or bottom monolayer of the group 45b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a–45n as some of the silicon atoms in each of these layers will be bonded to non-semiconductor atoms (i.e., oxygen in the present example), as will be appreciated by those skilled in the art.

In other embodiments, more than one such monolayer may be possible. It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a–46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure.

It is also theorized that the semiconductor device, such as the illustrated MOSFET 20, enjoys a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example, such as those set forth in the co-pending application entitled INTEGRATED CIRCUIT COMPRISING AN ACTIVE OPTICAL DEVICE HAVING AN ENERGY BAND ENGINEERED SUPERLATTICE, U.S. patent application Ser. No. 10/936,903, which is assigned to the present Assignee and is hereby incorporated herein in its entirety by reference.

As will be appreciated by those skilled in the art, the source/drain regions 22/26, 23/27 and gate 35 of the MOSFET 20 may be considered as regions for causing the transport of charge carriers through the superlattice 25 in a parallel direction relative to the layers of the stacked groups 45a–45n. Other such regions are also contemplated by the present invention.

The superlattice 25 also illustratively includes a cap layer 52 on an upper layer group 45n. The cap layer 52 may comprise a plurality of base semiconductor monolayers 46.

The cap layer 52 may have between 2 to 100 monolayers of the base semiconductor, and, more preferably between 10 to 50 monolayers.

Each base semiconductor portion 46a–46n may comprise a base semiconductor selected from the group consisting of Group IV semiconductors, Group III–V semiconductors, and Group II–VI semiconductors. Of course, the term Group IV semiconductors also includes Group IV–IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 3, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto, that for a superlattice, such as the Si/O superlattice, for example, that the number of silicon monolayers should desirably be seven or less so that the energy band of the superlattice is common or relatively uniform throughout to achieve the desired advantages. However, eight or more layers may be used in other embodiments, depending upon the given application. The 4/1 repeating structure shown in FIGS. 3 and 4, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein as will also be appreciated by those skilled in the art.

Figure 5:
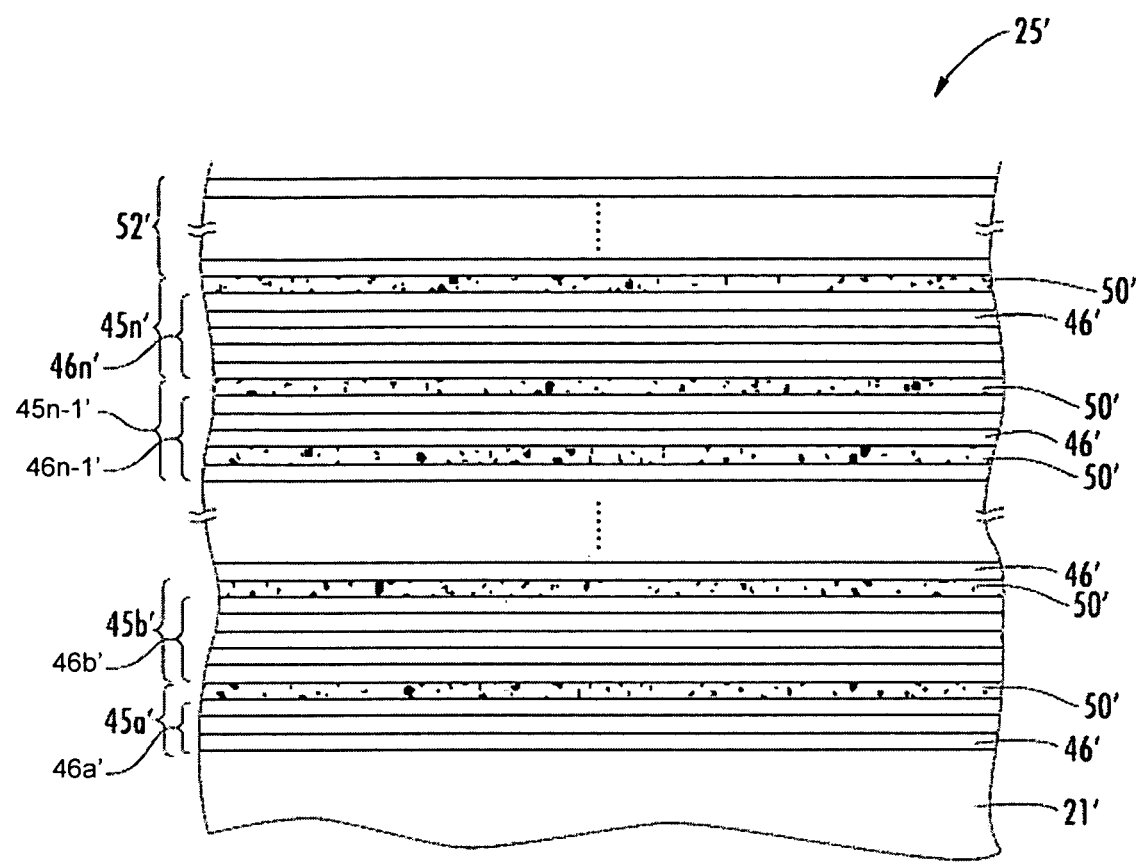
FIG. 5 is a greatly enlarged schematic cross-sectional view of another embodiment of a superlattice that may be used in the device of FIG. 2.

Indeed, referring now additionally to FIG. 5, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 5 not specifically mentioned are similar to those discussed above with reference to FIG. 3 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 6A:
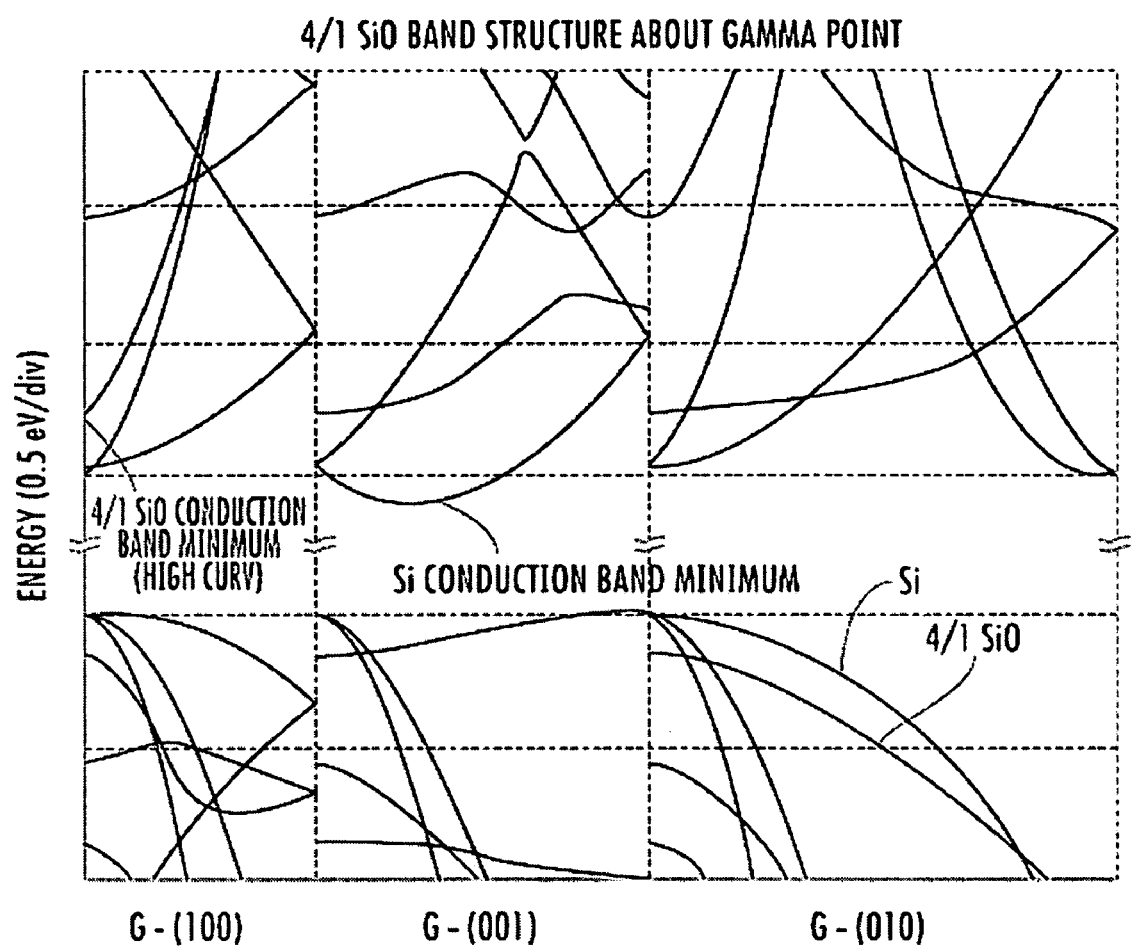
FIG. 6A is a graph of the calculated band structure from the gamma point (G) for both bulk silicon as in the prior art, and for the 4/1 Si/O superlattice as shown in FIGS. 2–4.
Figure 6B:
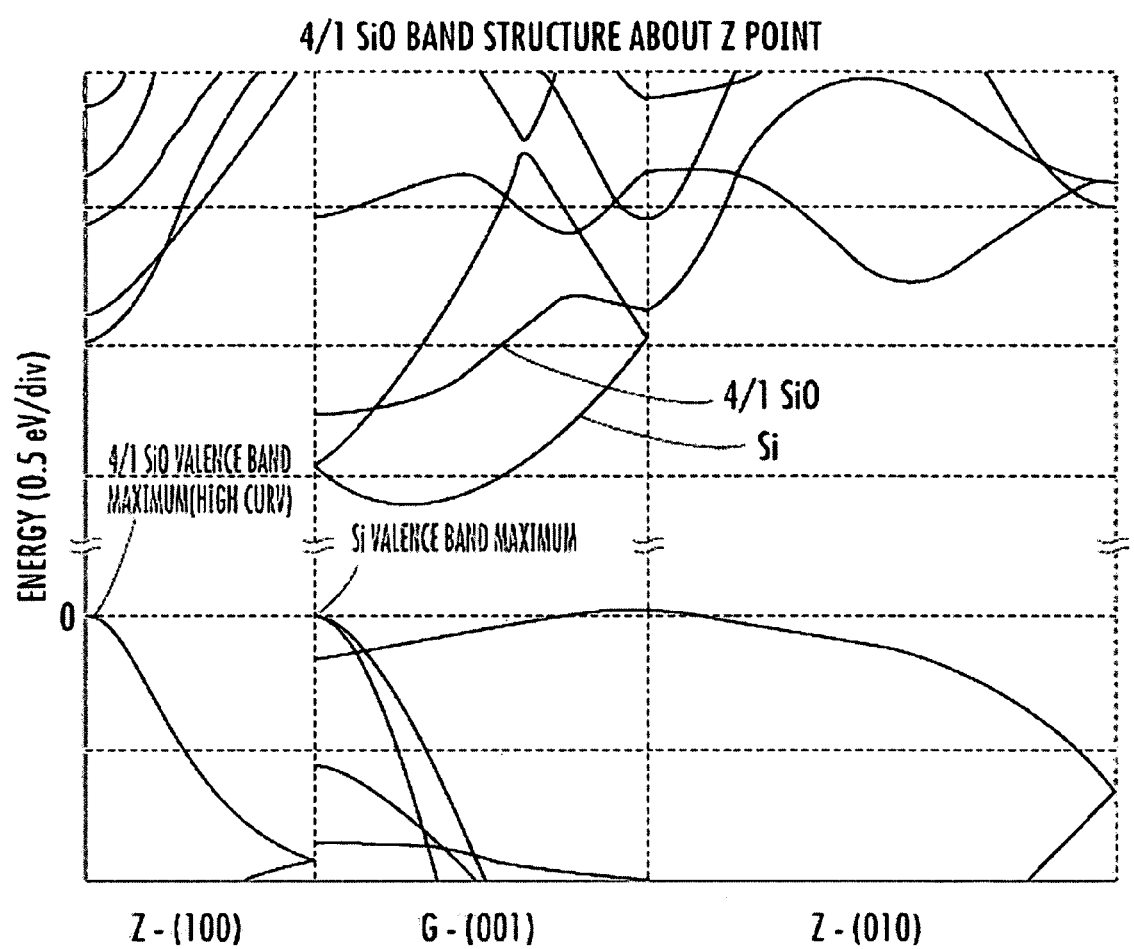
FIG. 6B is a graph of the calculated band structure from the Z point for both bulk silicon as in the prior art, and for the 4/1 Si/O superlattice as shown in FIGS. 2–4.
Figure 6C:
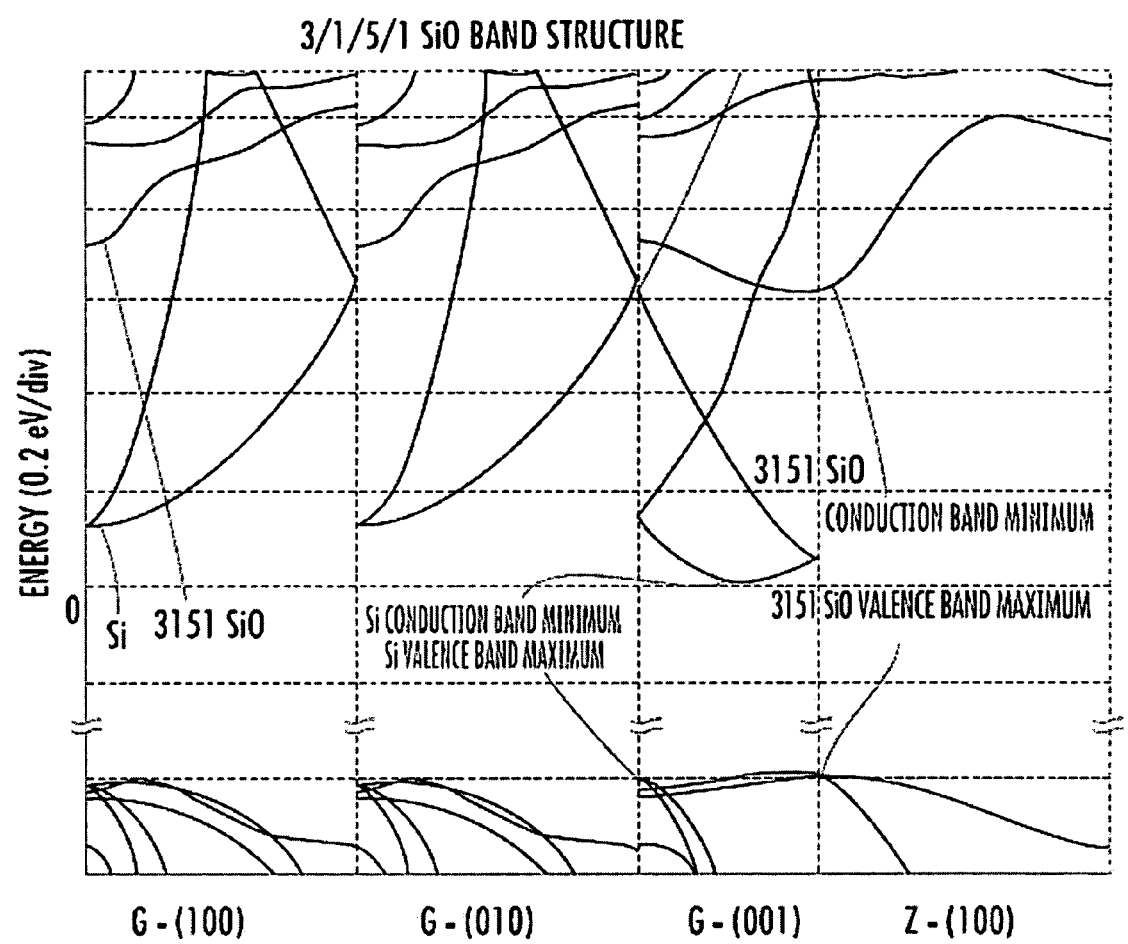
FIG. 6C is a graph of the calculated band structure from both the gamma and Z points for both bulk silicon as in the prior art, and for the 5/1/3/1 Si/O superlattice as shown in FIG. 5.

In FIGS. 6A–6C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

Figure 4:
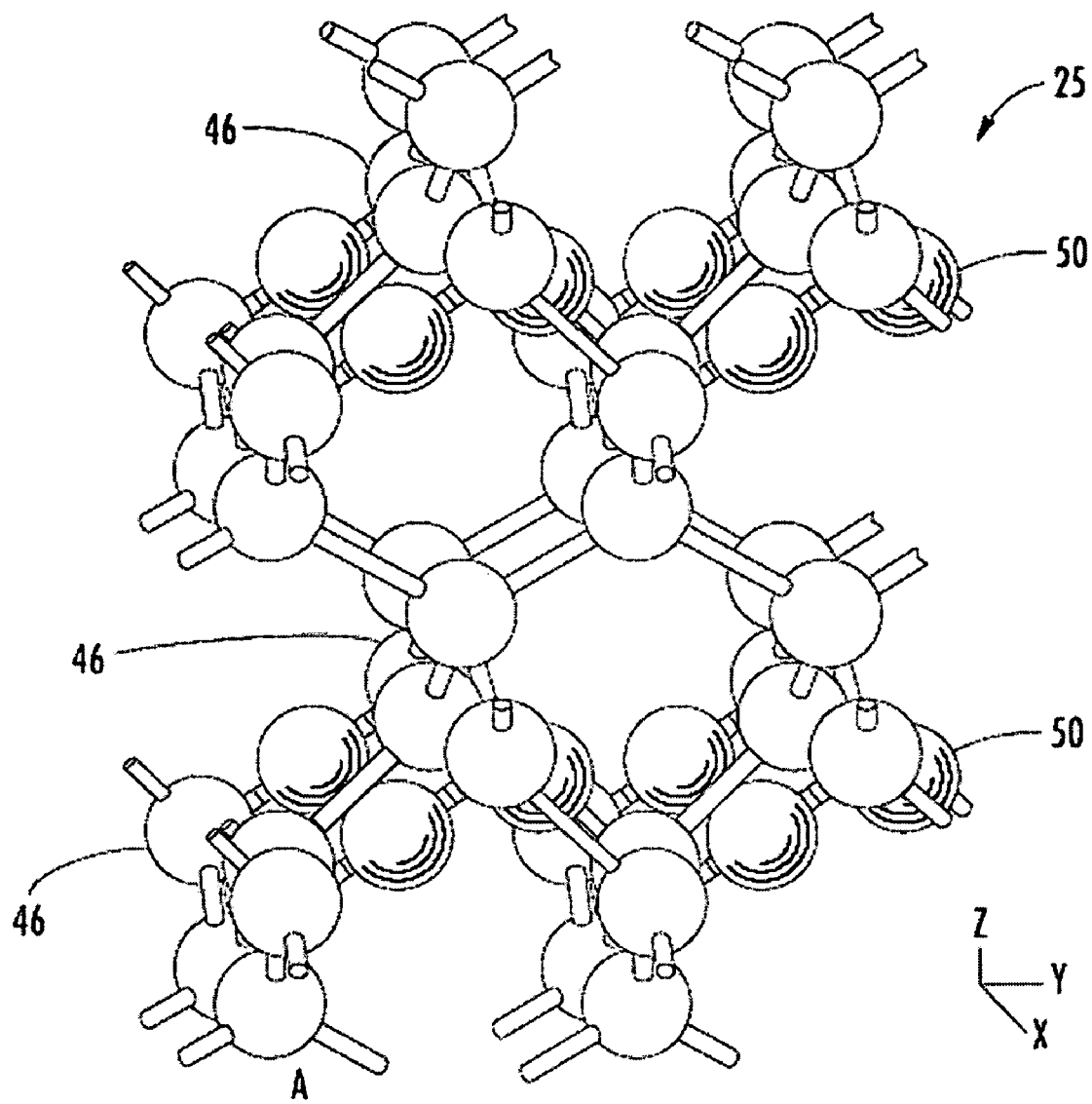
FIG. 4 is a perspective schematic atomic diagram of a portion of the superlattice shown in FIG. 2.

FIG. 6A shows the calculated band structure from the gamma point (G) for both bulk silicon (represented by continuous lines) and for the 4/1 Si/O superlattice 25 as shown in FIGS. 3–4 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 6B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 6C shows the calculated band structure from the both the gamma and Z point for both bulk silicon (continuous lines) and for the 5/1/3/1 Si/O structure of the superlattice 25' of FIG. 4 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Referring now additionally to FIG. 1, a method for making a semiconductor device including the superlattice 25, such as the MOSFET 20, will now be described. The superlattice 25 may be formed on the silicon substrate 21. By way of example, the substrate 21 may be an eight-inch wafer of lightly doped P-type or N-type single crystal silicon with <100> orientation, although other suitable substrates may also be used.

The superlattice 25 material is formed across the upper surface of the substrate 21 or portions thereof. Generally speaking, one or more anneals are advantageously performed prior to completing the superlattice 25. That is, one or more anneals are performed intermediately during formation of the superlattice 25, rather than simply annealing the entire superlattice after it is completed. Applicants theorize, without wishing to be bound thereto, that performing such intermediate anneals enables the atomic structure at the interface with the energy band-modifying layer 50 to provide less defects and thus smoother surfaces, which makes the superlattice 25 more suitable for device integration, as will be discussed further below. More particularly, the anneal allows the oxygen to enter the lower energy position for oxygen sandwiched between two silicon layers (i.e., the lowest energy for "bulk" silicon-oxygen-silicon versus oxygen sitting on a surface). The top silicon layer is sufficiently thin, however, that while constraining the position of the oxygen, it can re-arrange to take up the crystal structure configuration or orientation of the silicon layer below the oxygen.

It should be noted that if the top silicon layer is too thick (e.g., greater than eight monolayers), it may be too rigid or confined to re-arrange. Moreover, the lowest energy positions (i.e., bonding configurations) for oxygen are different if it is on a surface or in a silicon matrix, as will be appreciated by those skilled in the art. It is desirable to have the oxygen bond in its silicon matrix environment position, as this allows epitaxial silicon growth to be re-started.

Beginning at Block 100, a non-semiconductor monolayer (s) is formed, e.g., on the substrate 21, at Block 101. By way of example, in the case of oxygen the exposure time may preferably be in range of less than about eight seconds, although other exposure times may also be used. One or more base semiconductor monolayers 46 are then formed by successive atomic layer deposition, at Block 102. Deposition may be performed using silane, disilane, trisilane, or other suitable deposition agents at a temperature in a range of about 425 to 625° C. and at a pressure in a range of about 20 to 80 Torr, for example. Nitrogen or hydrogen may be used as a delivery agent with about a 20 to 40 SLM.

An intermediate anneal is then performed, at Block 103. In general, the number of base semiconductor monolayers 46 of a group 46a–46n that should be formed before performing an anneal will depend upon the total number of base semiconductor monolayers in the given group. That is, for groups 46a–46n with a relatively small number of base semiconductor monolayers 46 (e.g., four or less), an anneal may only need to be performed after all of the monolayers in the group have been deposited.

On the other hand, if a group 46a–46n has a relatively large number of base semiconductor monolayers 46 (e.g., more than four), then it may be desirable to perform an anneal before depositing all of the layers of the group. By way of example, in a repeating 8/1 structure, it may be desirable to perform an anneal after the bottom four layers of each group are formed. Preferably, anneals should be performed after completing the deposition of no more than eight base semiconductor monolayers, and, more preferably, after no more than four base semiconductor monolayers.

It should be noted that a respective anneal step(s) need not be performed for each group 46a–46n in the superlattice 25 in all embodiments. For example, in some applications it may be desirable to perform an anneal for every other group, or just the lower and/or upper groups, etc.

The anneals may be performed by stopping the deposition gas (e.g., silane) flow and increasing the temperature to be within a range of about 550 to 750° C., and, more preferably, in a range of about 625 to 675° C. Each anneal may be performed for a time period in a range of about one to thirty minutes, and more preferably in a range of about five to fifteen minutes. The anneals may be performed using rapid thermal processing lamps, for example, although other suitable techniques known to those skilled in the art may also be used. Once the anneal is complete, at Block 104, if any base semiconductor monolayers 46 in the current group remain to be formed this is done in the same manner described above, at Blocks 105–106. If more groups 46a–46n are to be formed, at Block 107, then the foregoing steps are repeated to form the next group. Otherwise, the base semiconductor cap 52 may optionally be formed on the uppermost group 45n to complete the superlattice, at Block 108, thus concluding the illustrated method (Block 109).

Figure 7:
FIGS. 7 and 8 are transmission electron microscopic (TEM) views of 3 and 6-layer superlattice base semiconductor layer groups, respectively, formed without intermediate annealing in accordance with the present invention.
Figure 8:

The reduction in defects and associated increase in smoothness achieved by the above-described intermediate anneals will be more fully appreciated with reference to the transmission electron microscopy (TEM) images shown in FIGS. 7–10. In particular, a group comprising three base silicon monolayers which has been exposed to oxygen for one second without first being annealed is shown in FIG. 7. The defects causing the surface roughness on this structure become even more pronounced for the group of six base silicon monolayers shown in FIG. 8, which has similarly been exposed to oxygen for one second without first being annealed.

Figure 9:
FIGS. 9 and 10 are TEM views of 3 and 8-layer superlattice base semiconductor layer groups, respectively, formed with intermediate annealing in accordance with the present invention.
Figure 10:

Yet, annealing prior to formation of the oxygen layer as described above provides a significant reduction in defects and, thus, improved surface smoothness. The structure illustrated in FIG. 9 is of the same three base silicon monolayer group illustrated in FIG. 7 but with an anneal performed thereon prior to oxygen exposure. In the illustrated example, the oxygen exposure was for two seconds. An eight base silicon monolayer group is illustrated in FIG. 10, in which anneals were performed after deposition of the first four base silicon monolayer, and before oxygen exposure (which was 1.5 seconds in this example).

Additional method steps not illustrated in FIG. 1 may include forming the source and drain regions 22/26, 23/27 laterally adjacent the channel provided by the superlattice 25, and forming the gate 35 overlying the superlattice channel and the remaining structural features illustrated in FIG. 1. These steps may be readily performed using well-known semiconductor techniques, as will be appreciated by those skilled in the art. Additional details regarding such steps may be found in co-pending application entitled SEMICONDUCTOR DEVICE COMPRISING A SUPERLATTICE CHANNEL VERTICALLY STEPPED ABOVE SOURCE AND DRAIN REGIONS, U.S. patent application Ser. No. 10/940,426, for example, which is assigned to the present Assignee and is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a superlattice comprising a plurality of stacked groups of layers, each group of layers comprising a plurality of stacked base semiconductor monolayers defining a base semiconductor portion and at least one non-semiconductor monolayer selected from the group consisting essentially of oxygen, nitrogen, fluorine, and carbon-oxygen constrained within a crystal lattice of adjacent base semiconductor portions, and opposing base semiconductor portions in adjacent groups of layers being chemically bound together; and
    performing at least one anneal prior to completing forming of the superlattice.

2. The method according to claim 1 wherein forming the superlattice comprises forming each group by successive deposition of the plurality of base semiconductor monolayers; and wherein performing the at least one anneal comprises performing the at least one anneal prior to completing the deposition of all of the plurality of base semiconductor monolayers in at least one group of layers.

3. The method according to claim 2 wherein performing the at least one anneal comprises performing the at least one anneal after completing the deposition of at least one of the plurality of base semiconductor monolayers in at least one group of layers.

4. The method according to claim 2 wherein performing the at least one anneal comprises performing the at least one anneal after completing the deposition of no more than eight base semiconductor monolayers.

5. The method according to claim 2 wherein performing the at least one anneal comprises performing the at least one anneal after completing the deposition of no more than four base semiconductor monolayers.

6. The method according to claim 1 wherein performing the at least one anneal comprises performing the at least one anneal at a temperature in a range of about 550 to 750° C.

7. The method according to claim 1 wherein performing the at least one anneal comprises performing the at least one anneal at a temperature in a range of about 625 to 675° C.

8. The method according to claim 1 wherein performing the at least one anneal comprises performing the at least one anneal for a time period in a range of about one to thirty minutes.

9. The method according to claim 1 wherein performing the at least one anneal comprises performing the at least one anneal for a time period in a range of about five to fifteen minutes.

10. The method according to claim 1 wherein each at least one non-semiconductor monolayer is a single monolayer thick.

11. The method according to claim 1 wherein each base semiconductor portion is less than eight monolayers thick.

12. The method according to claim 1 wherein the superlattice further comprises a base semiconductor cap layer on an uppermost group of layers.

13. The method according to claim 1 wherein all of the base semiconductor portions are a same number of monolayers thick.

14. The method according to claim 1 wherein at least some of the base semiconductor portions are a different number of monolayers thick.

15. The method according to claim 1 wherein each base semiconductor portion comprises a base semiconductor selected from the group consisting of Group IV semiconductors, Group III–V semiconductors, and Group II–VI semiconductors.

16. The method according to claim 1 wherein forming the superlattice comprises forming the superlattice on a substrate.

17. The method according to claim 1 further comprising doping the superlattice with at least one type of conductivity dopant therein.

18. The method according to claim 1 wherein the superlattice defines a channel for the semiconductor device and further comprising:
    forming source and drain regions laterally adjacent the superlattice channel; and
    forming a gate overlying the superlattice channel.

19. A method for making a semiconductor device comprising:
    forming a superlattice comprising a plurality of successively deposited groups of layers, each group of layers comprising a plurality of successively deposited base silicon monolayers defining a base silicon portion and at least one non-semiconductor monolayer constrained within a crystal lattice of adjacent base silicon portions, and opposing base silicon portions in adjacent groups of layers being chemically bound together; and
    performing at least one anneal prior to completing the deposition of all of the plurality of base silicon monolayers in at least one group of layers.

20. The method according to claim 19 wherein performing the at least one anneal comprises performing the at least one anneal after completing the deposition of no more than four base silicon monolayers.

21. The method according to claim 19 wherein performing the at least one anneal comprises performing the at least one anneal at a temperature in a range of about 625 to 675° C.

22. A method for making a semiconductor device comprising:
    forming a superlattice comprising a plurality of stacked groups of layers, each group of layers comprising a plurality of stacked base silicon monolayers defining a base silicon portion and at least one oxygen monolayer constrained within a crystal lattice of adjacent base silicon portions, and opposing base silicon portions in adjacent groups of layers being chemically bound together; and performing at least one anneal at a temperature in a range of about 550 to 750° C. and for a time period in a range of about one to thirty minutes prior to completing forming of the superlattice.

23. The method according to claim 22 wherein forming the superlattice comprises forming each group by successive deposition of the plurality of base silicon monolayers; and wherein performing the at least one anneal comprises performing the at least one anneal prior to completing the deposition of all of the plurality of base silicon monolayers in at least one group of layers.

24. The method according to claim 22 wherein performing the at least one anneal comprises performing the at least one anneal after completing the deposition of at least one of the plurality of base silicon monolayers in at least one group of layers.

25. The method according to claim 22 wherein performing the at least one anneal comprises performing the at least one anneal after completing the deposition of no more than four base silicon monolayers.

26. A method for making a semiconductor device comprising:

forming a superlattice comprising a plurality of stacked groups of layers, each group of layers comprising a plurality of stacked base semiconductor monolayers defining a base semiconductor portion and at least one non-semiconductor monolayer constrained within a crystal lattice of adjacent base semiconductor portions, and opposing base semiconductor monolayers in adjacent groups of layers being chemically bound together; and performing at least one anneal prior to completing forming of the superlattice.

27. The method according to claim 26 wherein forming the superlattice comprises forming each group by successive deposition of the plurality of base semiconductor monolayers; and wherein performing the at least one anneal comprises performing the at least one anneal prior to completing the deposition of all of the plurality of base semiconductor monolayers in at least one group of layers.

28. The method according to claim 27 wherein performing the at least one anneal comprises performing the at least one anneal after completing the deposition of at least of the plurality of base semiconductor monolayers in at least one group of layers.

29. The method according to claim 27 wherein performing the at least one anneal comprises performing the at least one anneal after completing the deposition of no more than eight base semiconductor monolayers.

30. The method according to claim 27 wherein performing the at least one anneal comprises performing the at least one anneal after completing the deposition of no than four base semiconductor monolayers.

31. The method according to claim 26 wherein performing the at least one anneal comprises performing the at least one anneal at a temperature in a range of about 625 to 675° C.

* * * * *

UNITED STATES PATENT AND TRADEMARK OFFICE
CERTIFICATE OF CORRECTION

PATENT NO. : 7,153,763 B2 Page 1 of 1
APPLICATION NO. : 11/136834
DATED : December 26, 2006
INVENTOR(S) : Hytha et al.

It is certified that error appears in the above-identified patent and that said Letters Patent is hereby corrected as shown below:

On the Title Page, Item (56) – References cited

Insert: -- Foreign Patent Documents

| | | |
|---|---|---|
| JP | 61220339 | 09/1996 |
| JP | 61145820 | 07/1986 |
| EP | 0 843 361 | 05/1998 |
| WO | 99/63580 | 12/1999 |
| WO | 02/103767 | 12/2002 |
| GB | 2,347,520 | 09/2000 |
| JP | 61027681 | 02/1986 |
| JP | 62219665 | 09/1987 |

--

Signed and Sealed this

Seventh Day of August, 2007

JON W. DUDAS
*Director of the United States Patent and Trademark Office*